United States Patent
Nagel (10) Patent No.: US 9,506,975 B2
(45) Date of Patent: Nov. 29, 2016

(54) METHOD FOR MEASURING POTENTIAL INDUCED DEGRADATION OF AT LEAST ONE SOLAR CELL OR OF A PHOTOVOLTAIC PANEL AS WELL AS THE USE OF SAME METHOD IN THE PRODUCTION OF SOLAR CELLS AND PHOTOVOLTAIC PANELS

(75) Inventor: Henning Nagel, Freiburg (DE)

(73) Assignee: Fraunhofer—Gesellschaft zur Förderung der angewandten Forschung e.V., Munich (DE)

( * ) Notice: Subject to any disclaimer, the term of this patent is extended or adjusted under 35 U.S.C. 154(b) by 268 days.

(21) Appl. No.: 14/123,842

(22) PCT Filed: Jun. 5, 2012

(86) PCT No.: PCT/EP2012/060613
§ 371 (c)(1),
(2), (4) Date: Jan. 29, 2014

(87) PCT Pub. No.: WO2012/168249
PCT Pub. Date: Dec. 13, 2012

(65) Prior Publication Data
US 2014/0132302 A1 May 15, 2014

(30) Foreign Application Priority Data

Jun. 5, 2011 (DE) .......... 10 2011 104 693
Jun. 16, 2011 (DE) .......... 10 2011 051 112

(51) Int. Cl.
*G01R 31/26* (2014.01)
*G01R 31/12* (2006.01)
(Continued)

(52) U.S. Cl.
CPC .......... *G01R 31/2605* (2013.01); *G01R 31/129* (2013.01); *H01L 22/14* (2013.01); *H02S 50/10* (2014.12)

(58) Field of Classification Search
CPC .. G01R 31/129; G01R 31/2642; H02S 50/10
See application file for complete search history.

(56) References Cited

U.S. PATENT DOCUMENTS 7,064,565 B1   6/2006   Xu et al.
7,649,365 B1   1/2010   Zapalac, Jr. et al.
(Continued)

FOREIGN PATENT DOCUMENTS

CN      101943744      1/2011
DE      4412297      10/1995
(Continued)

OTHER PUBLICATIONS

Official Action for Chinese Patent Application No. 201280038491.8 dated Jun. 18, 2015 and its English translation.
(Continued)

*Primary Examiner* — Minh N Tang
(74) *Attorney, Agent, or Firm* — Renner, Otto, Boisselle & Sklar, LLP (57) ABSTRACT

The invention relates to a method for measuring the high-voltage induced degradation (PID) of at least one solar cell. According to the invention, a conductive plastic material is pressed on the upper side or bottom side of the respective solar cell, in particular on the front side thereof, and a DC voltage greater than 50 V is applied between the plastic material and the respective solar cell. Alternatively, corona discharges may be applied to solar cells or photovoltaic modules. In one embodiment, a characteristic electric parameter of the respective solar cell or of the photovoltaic module is repeatedly measured at time intervals. The method according to the invention can be carried out on individual solar cells, which can be further processed directly after passing the test and without further complex processing, e.g. to a photovoltaic module. In principle, the method is also suitable for measurements on complete photovoltaic modules.

19 Claims, 4 Drawing Sheets

(51) Int. Cl.
*H01L 21/66* (2006.01)
*H02S 50/10* (2014.01)

(56) References Cited

U.S. PATENT DOCUMENTS

| | | |
|---|---|---|
| 2001/0040453 A1 | 11/2001 | Toyomura et al. |
| 2003/0117155 A1 | 6/2003 | Horner et al. |
| 2007/0018674 A1 | 1/2007 | Cho et al. |
| 2007/0246094 A1 | 10/2007 | Brabec et al. |
| 2010/0045265 A1* | 2/2010 | Kiesewetter ...... H01L 31/02008 324/149 |
| 2010/0117671 A1 | 5/2010 | Vaaler et al. |
| 2010/0304512 A1 | 12/2010 | Karpov et al. |
| 2011/0003404 A1 | 1/2011 | Wang et al. |
| 2011/0148432 A1 | 6/2011 | Apfelthaler |

FOREIGN PATENT DOCUMENTS

| | | |
|---|---|---|
| DE | 102009049704 | 4/2011 |
| DE | 102009049806 | 4/2011 |
| EP | 1024369 | 8/2000 |
| JP | 2002164557 | 6/2002 |
| JP | 2005236051 | 9/2005 |
| WO | 0177203 | 10/2001 |

OTHER PUBLICATIONS

Official Action for European Patent Application No. 12730409.5 dated Jan. 19, 2015.
S. Pingel et al.; "Potential Induced Degradation of Solar Cells and Panels"; 2010 35th IEEE PVSC Hawaii Solon.
J. Berghold et al.; "Potential Induced Degradation of Solar Cells and Panels"; Sep. 2010; pp. 3753-3759.
PCT/EP2012/060613; PCT International Search Report dated Dec. 17, 2012.
International Preliminary Report on Patentability for corresponding Application No. PCT/EP2012/060613 dated Dec. 10, 2013.
R.S. Sugimura et al.; "Electrical Isolation Design and Electrochemical Corrosion in Thin-Film Photovoltaic Modules"; pp. 1103-1109; 1988.

* cited by examiner

METHOD FOR MEASURING POTENTIAL INDUCED DEGRADATION OF AT LEAST ONE SOLAR CELL OR OF A PHOTOVOLTAIC PANEL AS WELL AS THE USE OF SAME METHOD IN THE PRODUCTION OF SOLAR CELLS AND PHOTOVOLTAIC PANELS

The present application claims the priority of German patent application DE 10 2011 104 693.7 "Method for measuring the high-voltage degradation of at least one solar cell", filed on 5 Jun. 2011 and DE 10 2011 051 112.1 "Method for measuring the high-voltage degradation of at least one solar cell or photovoltaic module", filed on 16 Jun. 2011, the whole contents of which are hereby expressly incorporated by way of reference.

FIELD OF INVENTION

The present invention generally relates to a method for measuring the high-voltage degradation (high-voltage stress (HVS) or potential induced degradation (PID)) of solar cells and more particularly relates to a method for measuring the high-voltage degradation of at least one solar cell. According to a preferred embodiment, in the method an elastic conductive plastic material is pressed on the respective solar cell and a characteristic electric parameter of the respective solar cell is measured repeatedly in regular time intervals. Other applications also relate to the high-voltage degradation and the measurement of corresponding characteristics for photovoltaic modules, which are ready for use. A further aspect of the present invention relates to the use of such a method in the production of solar cells or photovoltaic modules.

BACKGROUND OF INVENTION

A typical photovoltaic module comprises a plurality of solar cells that are connected in series by means of metal connectors. The solar cells are laminated into an embedding material which is isolating and serves for protection against weather conditions. Nowadays system voltages of several 100 V are regularly generated by series connection of the solar cells in a photovoltaic module and by series connection of several such photovoltaic modules to a system, which result in very high electric fields between solar cells and ground potential that result in undesired shift currents and leakage currents via the series circuit. As a result particularly charges may be deposited on the surface of the solar cells persistently that can significantly reduce the parallel resistance and thus their efficiency. In photovoltaic modules this process is particularly possible and maintained, because the solar cells are not encapsulated and isolated within the module so hermetically as this should be possible due to the material properties. The encapsulant material, in which the solar cells are embedded, the module frame and even the front cover glass allow the formation of leakage currents. These do not only exist in crystalline silicon solar cells but also in thin-film solar cells.

Hold J. Berg, O. Frank et al., "Potential Induced Degradation of solar cells and panels", 5$^{th}$ World Conference on Photovoltaic Energy Conversion, 6-10 Sep. 2010, Valencia, Spain, pp. 3753-3759, and S. Pingel, O. Frank et al., "Potential Induced Degradation of solar cells and panels", Proceedings of the 35th IEEE PVSC, 2010 disclose a procedure for testing modules, wherein a constant and continuous film of water is applied on the front cover glass by spraying or wherein a high humidity of e.g. 85% is set and wherein a high-voltage is applied between the cell array and the module frame. In repeating intervals the water film is removed and characteristic electric parameters are measured, in particular the current-voltage characteristics under illumination or the shunt resistance. Sometimes also a conductive coating is applied to the front side of the modules. In such a case, it must be removed in a time-consuming manner, before the current-voltage-characteristics under illumination are measured.

These test methods relate to completed photovoltaic modules, wherein the conductivity on the front side is increased by means of a water film or a conductive coating. On the other hand, a reliable test of individual solar cells does not exist, in particular a rapid test. Thus, there is no possibility to evaluate individual solar cells before being mounted into a photovoltaic module and possibly to sort out damaged cells. Also, no rapid test for photovoltaic modules exists, which avoids the use of water or high humidity or of a conductive coating.

EP 1 274 760 B1 and US 2007/0246094 A1 disclose electrodes of plastic material for solar cells that are either fixedly connected to the semiconductor surface by layer-deposition-techniques or that are present in the form of measuring tip electrodes that can be applied only locally onto a surface.

From EP 1 024 369 A1 detachable large area electrodes are known in the form of electrolytes, but this represents a different approach.

SUMMARY OF INVENTION

It is an object of the present invention to provide a simple method that enables a reliable testing of the stability of solar cells with regard to the application of charges and that can be performed quickly. Other applications also include corresponding testing methods for ready-for-use photovoltaic modules.

According to the present invention these problems are solved by a method according to claim 1 for measuring the high-voltage degradation of at least one solar cell or of a photovoltaic module and by the use of such methods according to claim 36. Further advantageous embodiments are the subject-matter of the dependent claims.

In a method according to the present invention for measuring the high-voltage degradation (PID) of at least one solar cell a conductive plastic material, in particular a conductive plastic material having a certain degree of elasticity, e.g. a suitable elastomeric resin or foam, is pressed on the front side or bottom side, in particular on the front side, of the respective solar cell and a DC voltage, which is higher than 50 V and particularly may be of the order of several 100 V, such as 6500 V, is applied between the conductive plastic material and the respective solar cell. Preferably, the respective solar cell is disposed directly on a grounded base plate, which is e.g. of stainless steel. Preferably, the DC voltage is applied uniformly on the front side and bottom side of the respective solar cell, in particular on the front side. Surprisingly, it has turned out that by means of such testing conditions real operation conditions can be well simulated. Particularly, leakage currents can be detected easily and reliably, without exposing the respective solar cell for this purpose to a humid environment or even to a permanent water film. Rather, according to the present invention the respective solar cell can be tested basically under dry conditions in a reliable manner and thus can be mounted in a photovoltaic module directly after passing a test successfully, without the need for complex cleaning and further processing steps in order to properly process the respective solar cell so that it can be used for being mounted.

The high-voltage may be applied to the conductive plastic material via a high-voltage electrode, wherein preferably the entire rear side of the conductive foam material, namely that side of the foam that faces away from the front side or bottom side of the solar cell, in particular from the front side, is coated with a conductive layer, in particular a metal layer or a metallization, in a portion opposite to the solar cell. Thus, charges can be spread in a more uniform manner.

According to an embodiment a characteristic electric parameter of the respective solar cell, such as a voltage-current-characteristic curve (UI-characteristics) and/or a shunt resistance, is repeatedly measured in time intervals while the high DC voltage is applied, for characterizing the respective solar cell and obtaining data, on the basis of which the quality and acceptability of the respective solar cell for mounting into a photovoltaic module may be assessed.

For providing reliable testing conditions, preferably the conductive plastic material is subjected to a predetermined pressure which is uniformly applied on the entire surface of the respective solar cell or solar cells, wherein the pressure preferably is adjusted such that the foam keeps its elastic characteristics and thus may be re-used for a new test. Therein, a certain minimum pressure should be obeyed in order to ensure a full-surface contact of the foam on the front side or bottom side, in particular on the front side, of the respective solar cell; this pressure may be e.g. 0.3 kPa.

As conductive plastic materials particularly elastic foams are suitable, which are produced on the basis of a plastic material produced on the basis of styrene or polyurethane, particularly produced also under an inert gas atmosphere, in particular an atmosphere of an inert noble gas. Furthermore, a conductive elastic rubber and silicon are suitable.

For a uniform distribution of the pressure over the entire area of the respective solar cell the pressure can be applied by means of an isolating plastic plate, which acts on the back side of the conductive plastic material. Here, particularly a fiber-reinforced plastic plate can be used, which enables a relatively high bending stiffness and thus an equalization of the pressure even in the case of local forces acting on the plastic plate.

According to a further embodiment the DC voltage from a high-voltage source is applied by means of at least one electrode, which is connected to that side of the respective solar cell that is remote from the back side, i.e. the aforesaid front side or bottom side, in particular the front side, of the respective solar cell side facing away from the conductive foam, and contacting the DC voltage.

Preferably, in the first and second method step, respectively, a first and a second electric voltage is respectively applied between the solar cell and a counter electrode or between the cell array of a photovoltaic module and a counter electrode. For this purpose, the back side of the solar cell or of the photovoltaic module is suitably supported on a grounded base plate, wherein the aforementioned first and second voltage is respectively applied by means of a counter electrode to the front side or bottom side, in particular to the front side, of the solar cell or photovoltaic module. Particularly, an elastic, conductive plastic material, which is pressed against the front side or bottom side, in particular to the front side, of the solar cell or of the photovoltaic module is suitable as a counter electrode. Suitably, the counter electrode is in full-surface contact with the front side or bottom side, in particular with the front side, of the solar cell or of the photovoltaic module and is pressed for this purpose by means of a pressure plate or the like against the front side or bottom side of the solar cell or of the photovoltaic module, in particular against the front side. The counter electrode does not necessarily abut to the entire surface of the front side or lower side of the solar cell or of the photovoltaic module, in particular to the front side, but does so in accordance with a further preferred embodiment.

According to a further embodiment, the characteristic electric parameter of the solar cell is measured by means of a measuring electrode, which passes through the conductive plastic material by means of an isolating sleeve, in particular by means of a plastic sleeve, and is in contact to the front side or bottom side of the respective solar cell, in particular to the front side, preferably to the metallization on the front side of the respective solar cell. For contacting the front side of the solar cell a touching contact may be sufficient. In this case, the thickness of the conductive plastic material may vary, for example depending on the testing conditions to be implemented, or due to the pressurization. Thus, the measuring electrode sleeves are preferably configured to be adjustable in height.

Alternatively, in the case of back-contact solar cells at least two separate contacts are provided in the apparatus on the back side.

Preferably, the sheet resistance of the conductive plastic material, i.e. the specific resistivity/thickness, is in the range between $10^5$ to $10^{11}$ $\Omega$/sq in order to ensure a uniform charging of the solar cell.

According to a further embodiment, the characteristic electric parameter of a plurality of solar cells is measured sequentially by connecting or switching the solar cells in a predetermined order and at predetermined time intervals by means of a multiplexer, to perform the respective testing measurements. According to a further embodiment the characteristic electric parameter of each solar cell can also be measured while the conductive plastic material is pressed onto the front side or bottom side of the respective solar cell, in particular onto the front side, and while the DC voltage is applied.

According to a further alternative embodiment, corona discharges are applied on the respective solar cell or the solar cells and the characteristic electric parameter of the respective solar cell is measured repeatedly in time intervals. In this embodiment, the above-mentioned conductive plastic material is not necessary; rather, the corona discharge can also be applied in the presence of a gas atmosphere, in particular air. The measurement is performed in a corresponding manner by means of a measuring electrode, which is in local contact with the front side or bottom side of the solar cell, in particular with the front side, as described above.

Preferably, the characteristic electric parameter is a current-voltage characteristic curve and/or a shunt resistance of the respective solar cell, which is measured over an extended time period, for example over twenty-four hours. On the basis of the time-dependency of the respective characteristic parameter it is possible to determine the high-voltage degradation.

According to a further embodiment, the test conditions may also include a higher humidity and/or temperature in the environment, for which purpose the solar cell to be tested may also be inserted into an climate chamber or the like, in which predetermined values and/or time-dependencies of these parameters can be set. The humidity can be for example 85% and the temperature can be for example 85° C.

A further aspect of the present invention also relates to the use of a method as described above, for measuring the high-voltage degradation of a photovoltaic module, in which a plurality of solar cells are mounted. Herein, the conductive plastic material is brought into contact with the front side, in particular the front-cover glass, of the photovoltaic module or the corona discharges are applied in this area. In one embodiment, a characteristic electric parameter is measured simultaneously in a corresponding manner. Even under such conditions, leakage currents, current-voltage characteristics, shunt resistances and the like of ready-for-use photovoltaic modules can be measured in a surprisingly simple and reliable manner while a high-voltage is applied.

BRIEF DESCRIPTION OF THE DRAWINGS

In the following the invention will be described in an exemplary manner and with reference to the accompanying drawings, from which further features, advantages and problems to be solved will become apparent. In the drawings.

DETAILED DESCRIPTION OF PREFERRED EMBODIMENTS

Figure 1:
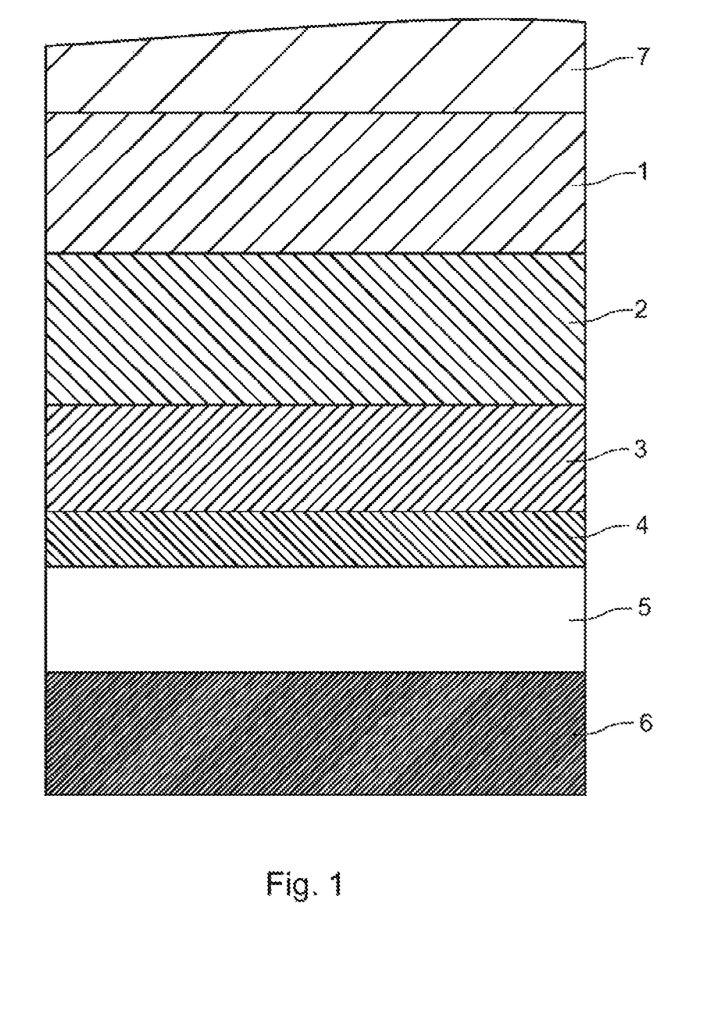
FIG. 1 is a schematic cross-section of the layer structure of a photovoltaic module, a conductive plastic material being applied on the front cover glass for carrying out a testing method according to the present invention.

Referring to FIG. 1, the schematic structure of a photovoltaic module will be described first, for which the measurement method according to the present invention can be performed. The photovoltaic module comprises a plurality of solar cells 4 which are embedded or encapsulated on the front side and the rear side in an embedding material 3, 5, e.g. EVA, so as to provide for a hermetic encapsulation and weatherproof isolation. Furthermore, a back sheet 6 is provided in the usual manner on the rear side. On the front side, the photovoltaic module is covered by a cover glass panel 2. Such a layered structure is embraced in the known manner in a frame (not shown). The conductive plastic material 1 is pressed against the cover glass panel 2 by means of the pressure plate 7 and a high-voltage is applied between the plastic material 1 and the solar cells 4. In a further embodiment, instead of the pressure plate 7 a second photovoltaic module is used, between the cell array thereof and the plastic material 1 also a high-voltage is applied.

Figure 3:
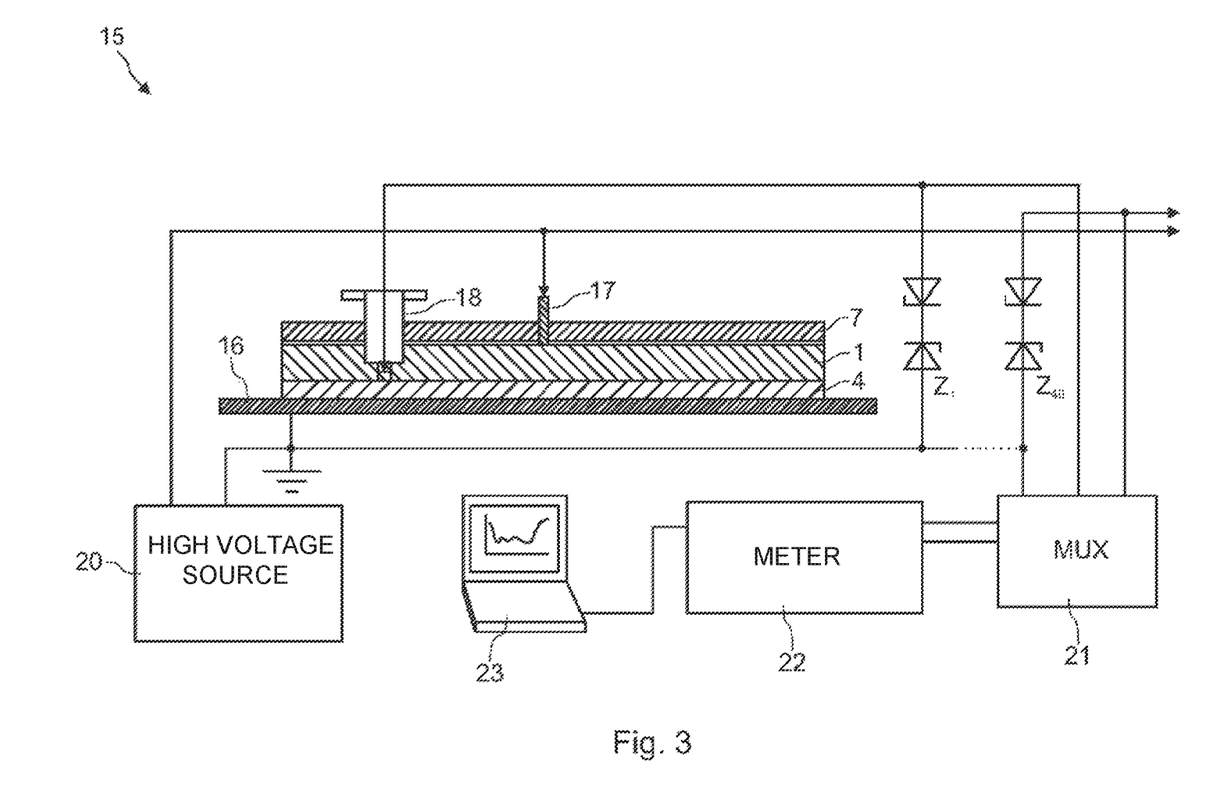
FIG. 3 shows a schematic representation of a measuring setup for carrying out the method according to the present invention.

Firstly, in the following the basic structure of a measuring device 15 for carrying out the method according to the present invention will be described with reference to FIG. 3, using the example of the measurement of the high-voltage degradation of a solar cell 4. This is supported on a grounded base plate 16, which is preferably made of a stainless steel. The rear side of the solar cell 4 is supported on the base plate 16. As shown in FIG. 3, an electrically conductive plastic material 1 is pressed onto the front side of the solar cell 4. This preferably has a sheet resistance (=specific resistivity/thickness) in the range between $10^5$ to $10^{11}$ Ω/sq. The rear side of the conductive plastic material 1, which is remote from the solar cell 4, may be provided with a metal plate 1 or a metallization (shown in FIG. 3 without reference numeral). The elastic plastic material 1 is uniformly pressurized by means of a pressure plate 7, which is preferably made of a fiber-reinforced plastic. This results in a full-surface contact of the plastic material 1 on the top surface of the solar cell 4, while maintaining a good electrical contact between the base plate 16 and the solar cell 4 and a constant electric potential difference between the pressure plate 7 and the solar cell 4. More specifically, the constant electrical potential difference is generated by applying a suitable voltage, preferably a high voltage, to the metal plate or to the metallization, wherein the rear side of the solar cell 4 rests with its entire surface on the grounded base plate 16. The pressure plate 7 does not only serve for applying a pressure, but also for isolating against the environment. For applying the high-voltage on the metal plate or metallization, at least one high-voltage contact electrode 17 extends through the pressure plate 7 up to the metal plate or metallization, each of which is connected to a high-voltage source 20. The high-voltage contact electrode 17 is suitably screwed into an isolating contact sleeve. The high-voltage contact electrode 17 is electrically isolated against the pressure plate 7.

Alternatively, the base plate 16 is isolating, so that the high-voltage can be applied to it and the ground potential can be applied to the conductive plastic material.

As will be readily apparent to the person skilled in the art, in a corresponding manner a voltage can also be applied to a photovoltaic module to be measured and evaluated.

Furthermore, at least one isolating contact sleeve 18 is screwed into the pressure plate 7, into which a measuring contact is inserted, which contacts the front side of the solar cell 4, in particular a front-surface metallization of the solar cell 4 to be evaluated, for measuring the characteristic electric parameter. Preferably, the measuring contact contacts the front-surface metallization of the solar cell 4. In the case of back contact solar cells without a front-surface metallization alternatively at least two separate terminals are provided on the back side in the apparatus.

If the solar cell 4 does not have a front side metallization, as it is the case with back contact solar cells, the base plate is made of isolating plastic material instead of stainless steel and is provided with conductive paths and possibly with contact pins, so that the two poles of the solar cell can be contacted separately for measuring the electric characteristic quantity.

The materials used in this configuration, particularly the plastic materials used, are suited for temperatures up to about 130° C., wherein the plate distance between the pressure plate 7 and the base plate 16 can be adjusted between 10 mm and 20 mm. The contact sleeves 18 are configured so that their height can be adjusted. In order to ensure that the conductive plastic material 1 does not slip laterally during the test, positioning means are provided on the pressure plate 7, for example embodied as lateral projections that keep the plastic material in its position.

As shown in FIG. 3, the base plate 16 is connected to a ground potential and the high-voltage contact electrode 17 is connected to a high-voltage source 20. Each measurement point, which is formed via the measuring contact 18, is connected in parallel with the measuring device 22, in particular a digital multimeter, via an oppositely disposed pair of Zener diodes Z1 . . . Z40 to protect against unwanted voltage spikes during the measurement. If voltages of e.g. greater than 12 V or less than −12 V should occur during the measurement at the measuring contacts 18, then the anti-parallel pair of Zener diodes breaks through and shortens the circuit. By means of the multiplexer 21 the characteristic electric parameters can be measured sequentially and in a predetermined time sequence at a plurality of discrete measuring points 18 corresponding to the aforementioned contact sleeves, by switching the respective measuring contact 18 on or through. The output signals of the measuring device 22 are passed to an analyzing device 23, for example a computer, which analyzes the measurement data and/or prepares a graphical analysis thereof.

For measuring at individual solar cells, these can be kept at predetermined positions on the base plate 16 by providing different test fields of standardized sizes, for example four inch by four inch, five inch by five inch, six inch by six inch, seven inch by seven inch, that are recessed in the front side of the base plate, for example in the form of recesses of a suitable size corresponding to the size of the respective solar cell to be measured, which are in particular etched or engraved.

Herein, the entire measurement area including the base plate 16, the conductive, resilient plastic material 1 and the pressure plate 7, can also be disposed in a climate chamber, in which any suitable ambient conditions can be simulated, including elevated temperatures, for example of 85° C., and/or a predetermined relative humidity, for example of 85%. Additionally or alternatively, only the conductive plastic material and/or the solar cell to be measured or the photovoltaic module to be measured can be kept at a predetermined temperature, for example above 40° C.

For a rapid test a voltage of preferably several hundred volts, for example 1000 V, is applied between the conductive plastic material 1 and the solar cell to be tested or the photovoltaic module to be tested. The module or the solar cell is separated from the voltage repeatedly at certain time intervals and the characteristic electric parameter is determined, in particular a current-voltage characteristic (IU), the characteristics under dark conditions and/or the characteristics under bright conditions and/or the shunt resistance. Alternatively, the characteristic electric parameters can be measured also without interrupting the high-voltage. It should be noted that, in general, also higher voltages can be applied, as set forth above, in particular voltages of up to 6,500 V.

Figure 4:
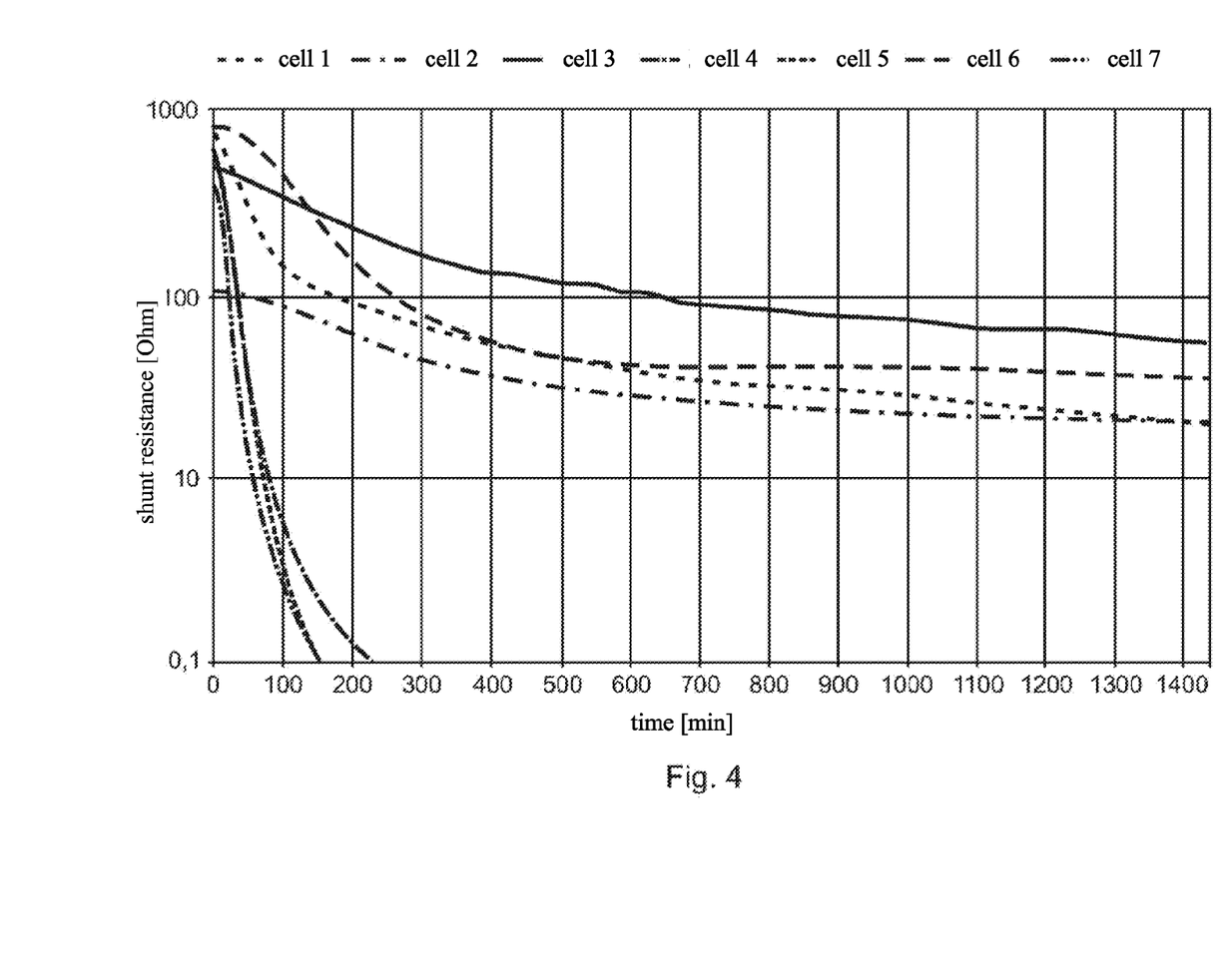
FIG. 4 shows measurement curves, which were obtained using the method according to the present invention.

FIG. 4 shows examplary waveforms for eight solar cells that were measured repeatedly over a time period of 1350 min. In FIG. 4, the respective shunt resistance is plotted over the time. It is apparent that some cells have degraded already after a short time and thus are not suitable for further use for mounting in a photovoltaic module.

As can be seen readily from FIG. 4, solar cells can be assessed and possibly sorted out in a meaningful manner within relatively short periods of time, such as overnight or a working day, for example, if the characteristic electrical parameter measured or a quantity derived from it is not within a predetermined range or exceeds a predetermined threshold value or falls below it.

Figure 2:
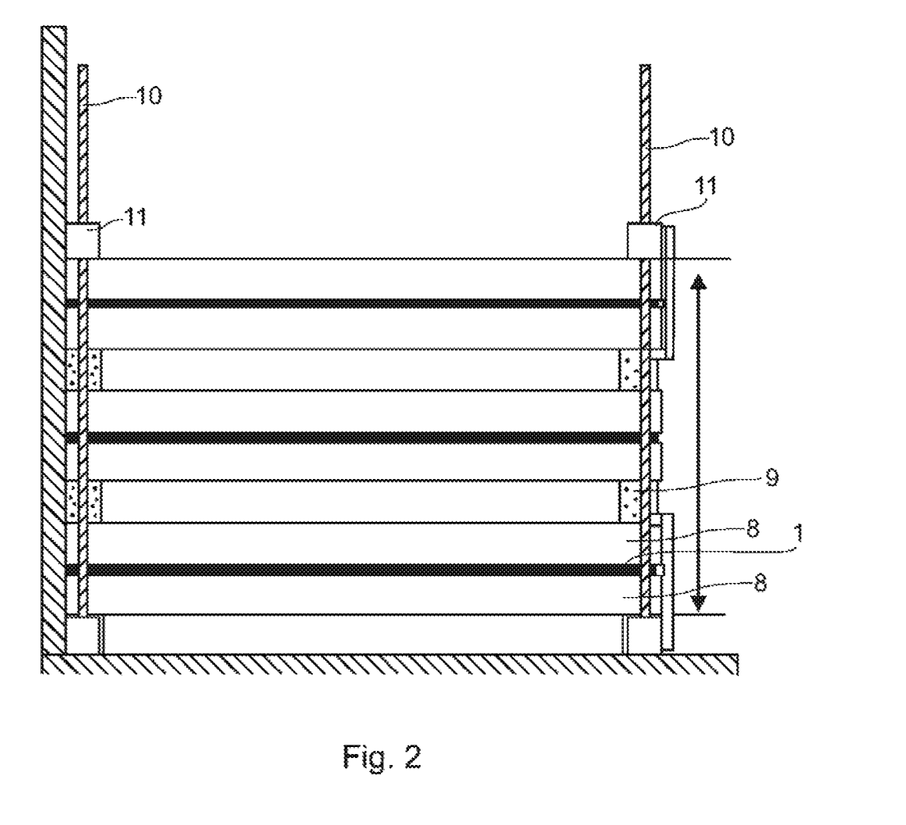
FIG. 2 shows in a schematic sectional view a measuring setup for the simultaneous degradation and measurement of a plurality of photovoltaic modules.

To ensure a reproducible result, the pressure of the conductive and elastic plastic material against the glass surfaces of photovoltaic modules should be set in a reproducible manner and at a constant value. For this purpose, e.g. the clamping device shown in FIG. 2 can be used, wherein a plurality of photovoltaic modules 8 are clamped along guiding rods 10 with the interposition of a respective conductive plastic layer 1. A spacer 9, which embraces the guiding rods 10, is laterally disposed between each two pairs of photovoltaic modules 8, so that a uniform pressure can be applied to respective pairs of photovoltaic modules 8 with the interposition of the conductive plastic material 1. In this clamping device, a uniform pressure must be applied to the lateral slide members 11, which can be easily implemented for example by means of a final cover plate (not shown). As indicated by the double arrow, be means of this clamping device a variable clamping width and a predetermined clamping pressure can be implemented.

Another important aspect of the present invention is directed to a measuring apparatus for carrying out the aforementioned measuring process or valuation process, as shown e.g. in FIG. 3.

A further important aspect of the present invention is further directed to a process for the production of solar cells and photovoltaic modules having a plurality of such solar cells using the afore-mentioned measuring process or evaluation process.

For this purpose, solar cells are initially produced using a suitable production method. Subsequently, the solar cells are evaluated individually or in groups by means of the measuring apparatus shown in FIG. 1. In such a process, only those solar cells are used further, for example packaged ready for use or further processed to form photovoltaic modules, for which the measured characteristic electrical parameter satisfies a predetermined criterion.

In a process for the production of photovoltaic modules, photovoltaic modules can also be produced initially using a suitable manufacturing process. Subsequently, the photovoltaic modules are each evaluated by means of the measuring apparatus shown in FIG. 1. In such a process only those photovoltaic modules are used further, for example packaged and assembled ready for use, for which the measured characteristic electrical parameter satisfies a predetermined criterion.

Although it is has been set forth above that the conductive plastic material is pressed or the corona discharge is applied to the front side of the solar cell or of the photovoltaic module, it will be apparent to the person skilled in the art when studying the above description, that in particular for solar cells and photovoltaic modules, namely those that are photosensitive on both sides, the conductive plastic material or the corona discharge can also be pressed or applied on the backside of the solar cell or of the photovoltaic module.

As will be apparent to the person skilled in the art when studying the above description, the process of the present invention can be used not only for a rapid test of individual solar cells or of a plurality of solar cells, but also for complete photovoltaic modules. Overall, in this manner meaningful characteristic parameters can be reliably derived within a relatively short time period, wherein it is not necessary to apply liquids or a finish or coating on the surface of the module. For solar cells in particular no isolating layers, in particular no antireflection layers, on the surface of the cells are damaged or removed. The testing method disclosed above is suitable for a fully automated test procedure and analysis. On the basis of the test results individual solar cells or photovoltaic modules may be sorted out (for example, if the measured characteristic electrical parameter or quantity derived from it is not within a predetermined range or exceeds a predetermined threshold value or falls below it), or these can be subjected to a further processing until the desired characteristic electric parameter is set. A particular advantage is that the process of the present invention can also be carried out rapidly at the level of individual cells, wherein the tested solar cells can then be further processed directly to a photovoltaic module without an additional costly treatment.

LIST OF REFERENCE NUMERALS 1 conductive plastic material
2 glass 3 embedding material on front side of a cell
4 solar cells
5 embedding material on back side of a cell
6 back sheet
7 pressure plate
8 photovoltaic module
9 spacers
10 guiding rod
11 sliding member
15 measuring apparatus
16 base plate
17 high-voltage contact electrode
18 measuring contact
20 high-voltage source
21 multiplexer
22 meter (digital multimeter or 4-quadrant source)
23 analyzing device (computer)

The invention claimed is:

1. A method for measuring the high-voltage degradation (PID) of at least one solar cell or of a photovoltaic module, wherein
a conductive plastic material is pressed on the front side of the respective solar cell or photovoltaic module, and
a voltage is applied between the conductive plastic material and the respective solar cell or the array of solar cells in the photovoltaic module;
in which method at least one characteristic electric parameter of the respective solar cell or of the photovoltaic module is repeatedly measured in time intervals for measurement of the high-voltage degradation, wherein the characteristic electric parameter is a voltage-current characteristic curve (UI) or a shunt resistance ($R_{shunt}$) of the respective solar cell.

2. The method according to claim 1, wherein the voltage is a DC voltage and wherein the DC voltage between the conductive plastic material and the respective solar cell or the array of solar cells in the photovoltaic module is greater than 50 volts.

3. The method according to claim 1, wherein the conductive plastic material is elastic to mate to the surface of the solar cell or of the photovoltaic module.

4. The method according to claim 1, wherein the conductive plastic material is a plastic produced on the basis of styrene or a polyurethane or is a foamed plastic.

5. The method according to claim 1, wherein the conductive plastic material is a conductive rubber or a conductive silicone.

6. The method according to claim 1, wherein the conductive plastic material is subjected to a predetermined pressure, which is uniformly applied on the surface of the respective solar cell or on the front side of the photovoltaic module.

7. The method according to claim 6, wherein the pressure of the conductive plastic material against the respective solar cell or photovoltaic module is made uniform over the surface of the respective solar cell or of the photovoltaic module by means of a plate.

8. The method according to claim 7, wherein the plate is electrically isolating and the voltage of a high-voltage source is applied on a side of the conductive plastic material facing away from the front side of the respective solar cell or photovoltaic module.

9. The method according to claim 1, wherein the pressure of the conductive plastic material against the respective solar cell or photovoltaic module is greater than 0.3 kPa.

10. The method according to claim 1, wherein the characteristic electric parameter is measured using a measuring electrode, which passes through the conductive plastic material by means of an isolating sleeve, and contacts the front side of the respective solar cell or of the photovoltaic module at a measuring contact.

11. The method according to claim 10, wherein each measuring contact is assigned to an oppositely disposed pair of Zener diodes (Z) for measuring the characteristic electric parameter.

12. The method according to claim 1, wherein the sheet resistance of the conductive plastic material is in the range between $10^5$ and $10^{11}$ Ω/sq.

13. The method according to claim 1, wherein the characteristic electric parameter of the respective solar cell is measured while the conductive plastic material is pressed on the front side of the respective solar cell or of the photovoltaic module and while said voltage is applied.

14. The method according to claim 1, wherein the characteristic electric parameter of the respective solar cell or of the photovoltaic module is measured, while the conductive plastic material is pressed on the front side, of the respective solar cell or of the photovoltaic modules and the voltage between the conductive plastic material and the solar cell or between the conductive plastic material and the array of solar cells in the photovoltaic module is temporarily disabled.

15. The method according to claim 1, wherein the high-voltage degradation of a plurality of the solar cells is measured, wherein the characteristic electric parameter of the plurality of the solar cells is measured sequentially, by switching the solar cells in a predetermined order by means of a multiplexer at predetermined time intervals.

16. The method according to claim 1, wherein the temperature of the respective solar cell or of the photovoltaic module and/or of the conductive plastic material is set to above 40° C.

17. The method according to claim 16, further comprising setting the humidity and/or temperature of an environment to which the at least one solar cell or the photovoltaic module is exposed to a predetermined value or time-dependency.

18. The method according to claim 1, wherein the solar cell is a back contact solar cell and the characteristic electric parameter is measured by means of a base plate on which are disposed local contact surfaces or in which local contact pins are located, which contact the minus or plus terminals of the respective solar cell separately.

19. The method according to claim 1, wherein the temperature of the respective solar cell or of the photovoltaic module and/or of the conductive plastic material is set at 85° C.

* * * * *